United States Patent
Nakanishi

(10) Patent No.: US 6,759,886 B2
(45) Date of Patent: Jul. 6, 2004

(54) CLOCK GENERATING CIRCUIT GENERATING A PLURALITY OF CLOCK SIGNALS

(75) Inventor: Jingo Nakanishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/138,264

(22) Filed: May 6, 2002

(65) Prior Publication Data
US 2003/0020529 A1 Jan. 30, 2003

(30) Foreign Application Priority Data
Jul. 24, 2001 (JP) ........................................ 2001-223355

(51) Int. Cl.[7] ................................................. H03K 3/00
(52) U.S. Cl. ....................... 327/295; 327/115; 327/118; 327/176; 377/47; 377/73
(58) Field of Search ................................. 327/293, 295, 327/115, 116, 117, 118, 165, 166, 175, 176, 202; 377/47, 48, 64, 72, 73

(56) References Cited

U.S. PATENT DOCUMENTS

| | | | | |
|---|---|---|---|---|
| 4,351,000 A | * | 9/1982 | Tokumatsu | ................. 358/158 |
| 5,010,561 A | * | 4/1991 | Itoh | ............................. 377/47 |
| 5,289,508 A | * | 2/1994 | Wada et al. | ................. 375/120 |
| 5,483,202 A | * | 1/1996 | Shenk | ......................... 331/1 A |
| 6,111,442 A | * | 8/2000 | Aulet et al. | .................. 327/156 |
| 6,130,561 A | * | 10/2000 | Dufour | ........................ 327/105 |
| 6,233,205 B1 | * | 5/2001 | Wells et al. | ................. 368/118 |
| 6,265,947 B1 | * | 7/2001 | Klemmer et al. | ............. 331/17 |
| 6,310,922 B1 | * | 10/2001 | Canfield et al. | ........ 375/240.28 |

FOREIGN PATENT DOCUMENTS

JP        7-56651        3/1995

* cited by examiner

*Primary Examiner*—Timothy P. Callahan
*Assistant Examiner*—An T. Luu
(74) *Attorney, Agent, or Firm*—McDermott, Will & Emery

(57) ABSTRACT

A clock generating circuit of a semiconductor integrated circuit device includes a plurality of stages of frequency-dividing circuits connected in series, of which a first stage receives a reference clock signal, each frequency-dividing circuit requiring no reset signal; and a plurality of buffers respectively transmitting a reference clock signal and output clock signals of the plurality of frequency-dividing circuits to an internal circuit of the semiconductor integrated circuit device. Therefore, a plurality of clock signals having different frequencies with aligned edges can be generated without the need for separately providing an external pin for inputting the reset signal or a circuit for generating the reset signal.

2 Claims, 18 Drawing Sheets

TIME  t

CLOCK GENERATING CIRCUIT GENERATING A PLURALITY OF CLOCK SIGNALS

BACKGROUND OF THE INVENTION

1. Field of the Invention

The present invention relates to a clock generating circuit, and particularly, to a clock generating circuit generating a plurality of clock signals having different frequencies.

2. Description of the Background Art

Conventionally, a semiconductor integrated circuit device is provided with a clock generating circuit for generating a plurality of internal clock signals having different frequencies with aligned edges. A plurality of internal clock signals are used when a portion (e.g. a core unit) is operated at a high speed while another portion (e.g. a bus interface unit) is operated at a low speed within the semiconductor integrated circuit device, or when an internal circuit is operated at a high speed in a normal operation while it is operated at a low speed under light load in order to reduce power consumption.

FIG. 26 is a circuit block diagram showing the configuration of such a clock generating circuit. In FIG. 26, the dock generating circuit includes frequency-dividing circuits 81 to 83, and buffers 84 to 87. Frequency-dividing circuit 81 includes, as shown in FIG. 27, a selector 90, a flip-flop 91 and an inverter 92. Flip-flop 91 captures the level of an output signal φ90 of selector 90 in the period during which a reference clock signal CLKR is at a logic low or "L" level, and outputs the captured level in response to the rising edge of reference clock signal CLKR. Output clock signal CLK1 of flip-flop 91 is applied to selector 90 via inverter 92. Selector 90 applies a logic high or "H" level (a power-supply potential VCC) to flip-flop 91 when a reset signal /RST is at an activated level of "L" level, whereas it applies an output signal of inverter 92 to flip-flop 91 when reset signal /RST is at an inactivated level of "H" level.

In the period during which reset signal /RST is at the activated level of "L" level, output signal φ90 of selector 90 is fixed at "H" level, an output clock signal CLK1 of flip-flop 91 is fixed at "H" level, and the output signal of inverter 92 is fixed at "L" level.

As shown in FIG. 28, when reset signal /RST is raised to be at the inactivated level of "H" level in synchronization with a rising edge (time t0) of reference clock signal CLKR, output signal φ90 of selector 90 is lowered to be at "L" level. A signal of "L" level is captured into flip-flop 91 in the period during which reference clock signal CLKR is at "L" level, and the captured signal of "L" level is output from flip-flop 91 in response to each rising edge of reference lock signal CLKR. The signal of "L" level output from flip-flop 91 is inverted at inverter 92 and then input into flip-flop 91. Thus, output clock signal CLK1 of flip-flop 91 is a signal obtained by dividing the frequency of reference clock signal CLKR by 1/2. Output clock signal CLK1 of frequency-dividing circuit 81 is applied to an internal circuit of the semiconductor integrated circuit device via buffer 85.

Frequency-dividing circuit 82 generates an internal clock signal CLK2 by dividing the frequency of reference clock signal CLKR by 1/4. Frequency-dividing circuit 82 employs two stages of flip-flops as a substitute for flip-flop 91 of frequency-dividing circuit 81. Output clock signal CLK2 of frequency-dividing circuit 82 is applied to the internal circuit via buffer 86.

Frequency-dividing circuit 83 generates an internal clock signal CLK3 by dividing the frequency of reference clock signal CLKR by 1/8. Frequency-dividing circuit 83 employs three stages of flip-flops as a substitute for flip-flop 91 of frequency-dividing circuit 81. Output clock signal CLK3 of frequency-dividing circuit 83 is applied to the internal circuit via buffer 87.

Moreover, reference clock signal CLKR is applied to the internal circuit via buffer 84. Thus, a plurality of internal clock signals CLKR, and CLK1 to CLK3 having different frequencies are generated with the rising edges aligned (at time t2).

Such a clock generating circuit must use reset signal /RST to align the rising edges; otherwise the timing at which each of frequency-dividing circuits 81 to 83 starts the frequency-dividing would be different from one another.

However, for the use of reset signal /RST, it was necessary to externally input reset signal /RST, or to separately provide e.g. a power-on reset circuit for generating reset signal /RST. This resulted in problems such that the number of external pins for the semiconductor integrated circuit device is increased, and the circuit configuration is complicated.

SUMMARY OF THE INVENTION

Therefore, a main object of the present invention is to provide a clock generating circuit that can generate a plurality of clock signals having different frequencies with the edges aligned, without external introduction of a reset signal.

According to one aspect of the present invention, a clock generating circuit includes a plurality of stages of frequency-dividing circuits connected in series, of which a first stage receives a reference clock signal, the plurality of stages outputting the plurality of clock signals. Each of the frequency-dividing circuits includes a plurality of stages of flip-flops connected in series, of which an input terminal of a first stage receives a first potential, each flip-flop capturing a potential of an input terminal in a period during which an input clock signal of each frequency-dividing circuit is at a second potential, outputting the captured potential in response to a change of the input clock signal of each frequency-dividing circuit from the second potential to the first potential, and being reset in response to an output of the first potential from a last stage of the plurality of stages of flip-flops, to output the second potential. An output clock signal of a predetermined flip-flop of the plurality of flip-flops will be an output clock signal of each frequency-dividing circuit. Thus, the plurality of frequency-dividing circuits requiring no reset signal are connected in series, so that a plurality of clock signals having different frequencies with the edges aligned can be generated without external introduction of the reset signal.

According to another aspect of the present invention, a clock generating circuit includes a phase control circuit controlling a phase of an output clock signal such that a phase of a feedback clock signal coincides with a phase of a reference clock signal; and a plurality of stages of frequency-dividing circuits connected in series, of which a first stage receives an output clock signal of the phase control circuit, the plurality of stages outputting a plurality of clock signals, and of which a last stage provides an output dock signal which is also used as the feedback clock signal. Thus, the plurality of frequency-dividing circuits are connected in series, so that a plurality of clock signals having different frequencies with the edges aligned can be generated without external introduction of the reset signal.

Preferably, each of the frequency-dividing circuits includes a plurality of stages of flip-flops connected in series, of which an input terminal of a first stage receives a first potential, each flip-flop capturing a potential of an input terminal in a period during which an input clock signal of each frequency-dividing circuit is at a second potential, outputting the captured potential in response to a change of the input clock signal of each frequency-dividing circuit from the second potential to the first potential, and being reset in response to an output of the first potential from a last stage of the plurality of stages of flip-flops, to output the second potential. An output clock signal of a predetermined flip-flop of the plurality of flip-flops is an output clock signal of each frequency-dividing circuit. In this case, the frequency-dividing circuits requiring no reset signal are connected in series, so that a plurality of clock signals having different frequencies with the edges aligned can be generated without external introduction of the reset signal.

More preferably, the phase control circuit is activated in response to a control signal being set to be at an activated level and is inactivated in response to the control signal being set to be at an inactivated level, and the reference clock signal is used as one clock signal of the plurality of clock signals in place of the output clock signal of the frequency-dividing circuit of the last stage. In this case, when there is no need for a clock signal with high frequency obtained by multiplying the reference clock signal, the phase control circuit can be inactivated to use only the reference signal, so that power consumption can be reduced.

More preferably, the clock generating circuit further includes a delay circuit provided corresponding to each of the plurality of frequency-dividing circuits except for the frequency-dividing circuit of the last stage, to delay an output clock signal of a corresponding frequency-dividing circuit, and to make a phase of the delayed clock signal coincide with a phase of an output dock signal of the frequency-dividing circuit of the last stage. In this case, the edges of the plurality of clock signals can be aligned with higher accuracy.

More preferably, the clock generating circuit further includes a compensating circuit provided corresponding to each of the frequency-dividing circuits, to compensate a duty ratio of an output clock signal of a corresponding frequency-dividing circuit to be at a predetermined value. In this case, the duty ratio of the plurality of clock signals can be adjusted to be at a predetermined value.

More preferably, the compensating circuit includes a flip-flop whose input terminal receives an output clock signal of a corresponding frequency-dividing circuit, capturing a potential of the input terminal in a period during which an input clock signal of a corresponding frequency-dividing circuit is at a second potential, and outputting the captured potential in response to a change of the input clock signal of the corresponding frequency-dividing circuit from the second potential to the first potential. In this case, the compensating circuit can readily be constituted.

More preferably, the compensating circuit includes a logic circuit receiving an output clock signal of a corresponding frequency-dividing circuit and a signal appearing at a predetermined node of the corresponding frequency-dividing circuit, and outputting a clock signal whose duty ratio is compensated. Also in this case, the compensating circuit can readily be constituted.

More preferably, a compensating circuit corresponding to each of the frequency-dividing circuits except for the frequency-dividing circuit of the last stage is interposed between a corresponding frequency-dividing circuit and a frequency-dividing circuit subsequent to the corresponding frequency-dividing circuit. In this case, a clock signal with the duty ratio compensated is applied to the subsequent frequency-dividing circuit, so that the frequency-dividing operation can be stabilized.

More preferably, the clock generating circuit further includes a delay circuit provided corresponding to each compensating circuit except for the compensating circuit of the last stage, to delay an output clock signal of a corresponding compensating circuit, and to make a phase of the delayed clock signal coincide with an output clock signal of the compensating circuit of the last stage. In this case, the edges of the plurality of clock signals can be aligned with higher accuracy.

According to a further aspect of the present invention, a clock generating circuit includes a phase control circuit controlling a phase of an output clock signal such that a phase of a feedback clock signal coincides with a phase of a reference clock signal; a plurality of stages of first frequency-dividing circuits connected in series, of which a first stage receives an output clock signal of the phase control circuit, each stage outputting a plurality of first clock signals, and of which a last stage provides a first clock signal which is also used as the feedback clock signal; and a plurality of stages of second frequency-dividing circuits connected in series, of which a first stage receives a first clock signal output from a first frequency-dividing circuit of the last stage, the plurality of stages of second frequency-dividing circuits outputting a plurality of second clock signals respectively. The second frequency-dividing circuit has the same configuration as that of the frequency-dividing circuit described above. Thus, the plurality of first frequency-dividing circuits are connected in series while the plurality of second frequency-dividing circuits requiring no reset signal are connected in series, so that a plurality of first clock signals and a plurality of second clock signals having different frequencies with aligned edges, respectively, can be generated without external introduction of the reset signal.

Preferably, the first frequency dividing circuit has the same configuration as that of the frequency-dividing circuit described above. In this case, a plurality of first frequency-dividing circuits requiring no reset signal are connected in series while a plurality of second frequency-dividing circuits requiring no reset signal are connected in series, so that a plurality of first clock signals and a plurality of second clock signals respectively having different frequencies with aligned edges can be generated without external introduction of the reset signal.

More preferably, the phase control circuit is activated in response to a control signal being set to be at an activated level, and is inactivated in response to the control signal being set to be at an inactivated level, and a second frequency-dividing circuit of the first stage receives the reference clock signal in place of the first clock signal output from the first frequency-dividing circuit of the last stage. In this case, when there is no need for a clock signal with high frequency obtained by multiplying the reference clock signal, the phase control circuit can be inactivated to use only the second clock signal with low frequency obtained by dividing the frequency of the reference clock signal, so that power consumption can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
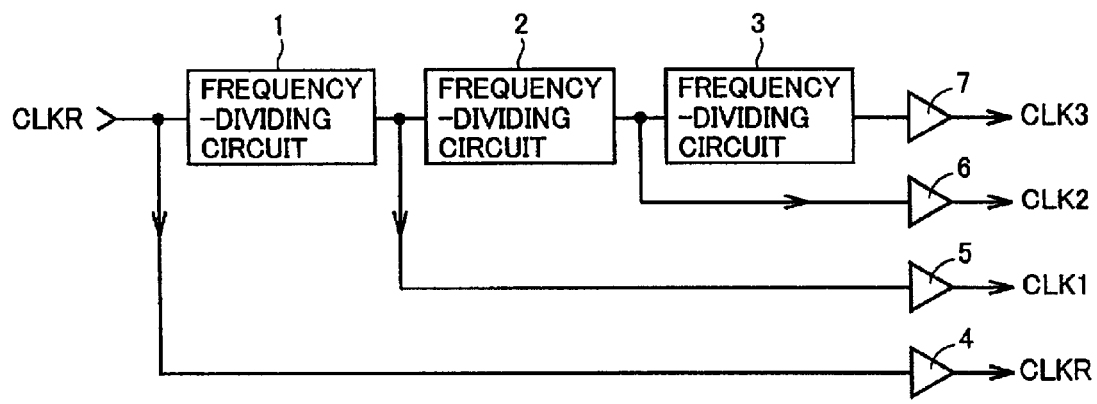
FIG. 1 is a circuit block diagram showing the configuration of a clock generating circuit of a semiconductor integrated circuit device according to the first embodiment of the present invention.

FIG. 1 is a circuit block diagram showing the configuration of a clock generating circuit of a semiconductor integrated circuit device according to the first embodiment of the present invention. The clock generating circuit generates a plurality of internal clock signals CLKR and CLK1 to CLK3 having different frequencies with aligned edges, without it externally receiving a reset signal, in accordance with an externally-applied reference clock signal CLKR, and applies the generated signals to an internal circuit (not shown) of the semiconductor integrated circuit device.

Referring to FIG. 1, the clock generating circuit includes frequency-dividing circuits 1 to 3, and buffers 4 to 7. Reference clock signal CLKR is input into frequency-dividing circuit 1 and is also applied to the internal circuit via buffer 4. Frequency-dividing circuit 1 has a predetermined frequency-dividing ratio of $1/i$ (wherein i is an integer equal to or higher than 2), and generates a clock signal CLK1 by dividing the frequency of reference clock signal CLKR. A frequency $f1$ of clock signal CLK1 is $1/i$ times a frequency $f0$ of reference clock signal CLKR ($f1=f0/i$). Clock signal CLK1 is input into frequency-dividing circuit 2, and also is applied to the internal circuit via buffer 5.

Frequency-dividing circuit 2 has a predetermined frequency-dividing ratio of $1/j$ (wherein j is an integer equal to or higher than 2), and divides the frequency of clock signal CLK1 output from frequency-dividing circuit 1 to generate dock signal CLK2. A frequency $f2$ of clock signal CLK2 is $1/j$ times the frequency $f1=f0/i$ of clock signal CLK1 ($f2=f0/ij$). Clock signal CLK2 is input into frequency-dividing circuit 3, and also is applied to the internal circuit via buffer 6.

Frequency-dividing circuit 3 has a predetermined frequency-dividing ratio of $1/k$ (wherein k is an integer equal to or higher than 2), and divides the frequency of clock signal CLK2 output from frequency-dividing circuit 2 to generate clock signal CLK3. A frequency $f3$ of clock signal CLK3 is $1/k$ times the frequency $f2=f0/ij$ of clock signal CLK2 ($f3=f0/ijk$). Clock signal CLK2 is applied to the internal circuit via buffer 7.

In this clock generating circuit, it is possible for the three frequency-dividing circuits 1 to 3 to each start the frequency-dividing at a timing independent of each other due to the absence of a reset signal. However, the three frequency-dividing circuits 1 to 3 are connected in series, so that the four clock signals CLKR and CLK1 to CLK3 will finally have their edges aligned. Therefore, according to the clock generating circuit, a plurality of clock signals with aligned edges can be generated without external introduction of a reset signal.

Though three frequency-dividing circuits 1 to 3 are connected in series in the first embodiment, the present invention is not limited thereto, and it is understood that two frequency-dividing circuits, or four or more frequency-dividing circuits may be connected in series. The specific configuration of a frequency-dividing circuit will be described below.

EXAMPLE 1

Figure 2:
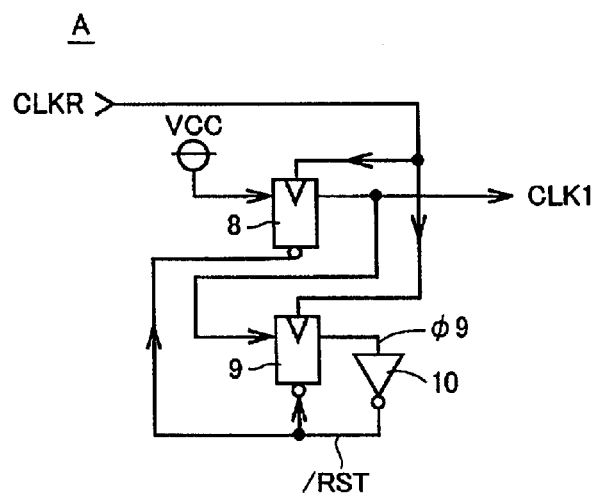
FIG. 2 is a circuit block diagram showing the first illustrative example of the frequency-dividing circuit shown in FIG. 1.

FIG. 2 is a circuit block diagram showing the configuration of a frequency-dividing circuit A having a frequency-dividing ratio of 1/2. FIG. 2 shows this frequency-dividing circuit used as a frequency-dividing circuit 1 of the first stage.

Referring to FIG. 2, frequency-dividing circuit A includes flip-flops 8, 9 with reset function, and an inverter 10. Each of Flip-flops 8, 9 has a clock terminal into which reference clock signal CLKR is input, and a reset terminal into which reset signal /RST generated in frequency-dividing circuit 1 is input. An input terminal of flip-flop 8 is supplied with a power-supply potential VCC ("H" level), and the signal output from flip-flop 8 will be clock signal CLK1 of frequency-dividing circuit 1. Clock signal CLK1 is applied to an input terminal of flip-flop 9, and an output signal $\phi 9$ of flip-flop 9 is inverted at inverter 10 to be reset signal /RST.

Figure 3:
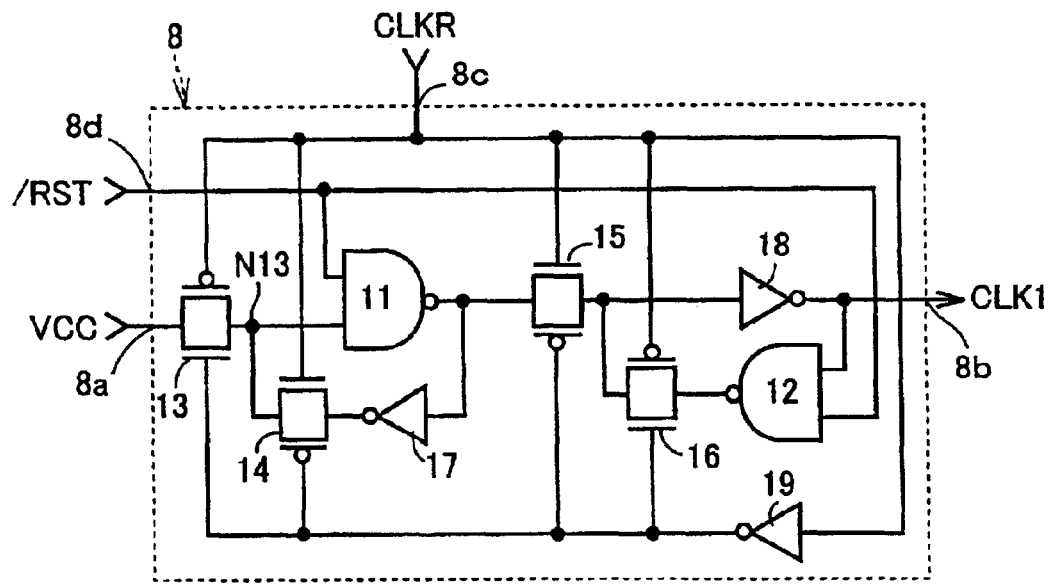
FIG. 3 is a circuit diagram showing the configuration of a flip-flop shown in FIG. 2.

Flip-flop 8 includes, as shown in FIG. 3, an input terminal 8a, an output terminal 8b, a clock terminal 8c, a reset terminal 8d, NAND gates 11 and 12, transfer gates 13 to 16, and inverters 17 to 19. Reset signal /RST is input into one input node of each of NAND gates 11, 12 via reset terminal 8d. Input terminal 8a is supplied with power-supply potential VCC. Transfer gate 13 is connected between input terminal 8a and the other input node N13 of NAND gate 11. An output signal of NAND gate 11 is input into the other input node N13 of NAND gate 11 via inverter 17 and transfer gate 14. Moreover, an output signal of NAND gate 11 is output to output terminal 8b via transfer gate 15 and inverter 18. Output signal CLK1 of inverter 18 is input into the other input node of NAND gate 12, and an output signal of NAND gate 12 is applied to an input node of inverter 18 via transfer gate 16.

Reference clock signal CLKR is directly input into the gate of the P-channel MOS transistor side of each of transfer gates 13, 16 and into the gate of the N-channel MOS transistor side of each of transfer gates 15, 14 via clock terminal 8c, and also input into the gate of the N-channel MOS transistor side of each of transfer gates 13, 16 and into the gate of the P-channel MOS transistor side of each of transfer gates 15, 14 via clock terminal 8c and inverter 19.

When reset signal /RST is at an inactivated level of "H" level, each of NAND gates 11, 12 operates as an inverter for a signal input into the other input node thereof. When reference clock signal CLKR is at "L" level, transfer gates 13, 16 are rendered conductive while transfer gates 14, 15 are rendered non-conductive, and node N13 is set to be at "H" level while the level of output terminal 8b is latched by NAND gate 12, transfer gate 16 and inverter 18. When reference clock signal CLKR is raised to be at "H" level, transfer gates 13, 16 are rendered non-conductive while transfer gates 14, 15 are rendered conductive, and the level of node N13 is latched by NAND gate 11, inverter 17 and transfer gate 14, while the level of node N13 is transmitted to output terminal 8b via NAND gate 11, transfer gate 15 and inverter 18.

When reset signal /RST is at an activated level of "L" level, output signals of NAND gates 11, 12 are both fixed at "H" level. When reference clock signal CLKR is at "L" level, an output signal of NAND gate 12 is output to output terminal 8b via transfer gate 16 and inverter 18, whereas when reference clock signal CLKR is at "H" level, an output signal of NAND gate 11 is output to output terminal 8b via transfer gate 15 and inverter 18. Therefore, when reset signal /RST is at the activated level of "L" level, output terminal 8b is fixed at "L" level. Flip-flop 9 has the same configuration as that of flip-flop 8.

Figure 4:
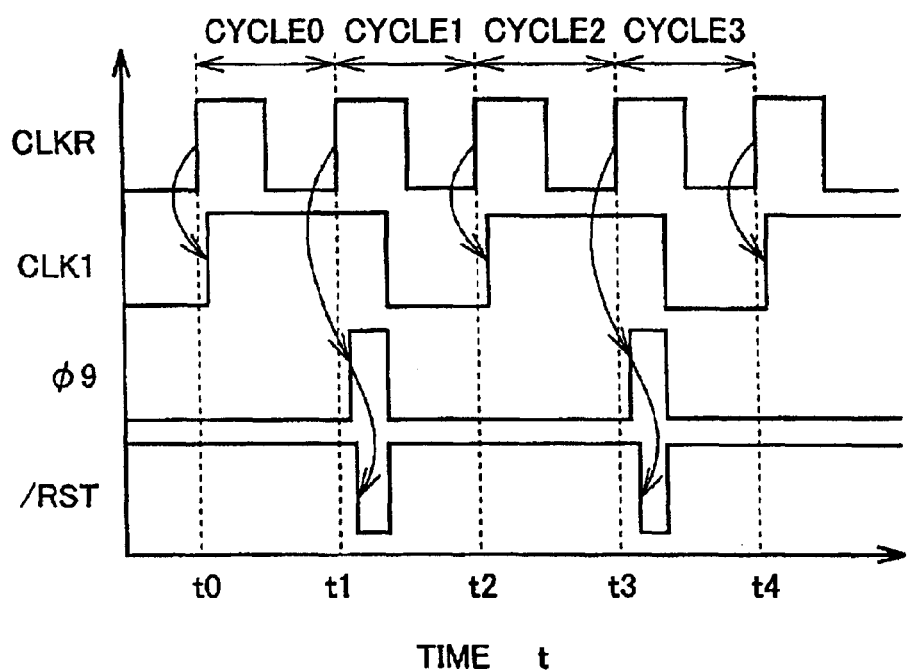
FIG. 4 is a time chart illustrating the operation of the frequency-dividing circuit shown in FIG. 2.

FIG. 4 is a time chart illustrating the operation of frequency-dividing circuit A shown in FIGS. 2 and 3. Referring to FIG. 4, reset signal /RST is lowered to be at "L" level in response to the rising edge in a cycle 1 (time t1) of reference clock signal CLKR, and flip-flops 8, 9 are reset, lowering respective output signals CLK1, $\phi 9$ of flip-flops 8, 9 to be at "L" level. In the period during which reference clock signal CKLR in cycle 1 is at "L" level, "H" level is captured by flip-flop 8 whereas "L" level is captured by flip-flop 9.

Output signal CLK1 of flip-flop 8 is raised to be at "H" level in response to the rising edge in a cycle 2 (time t2) of reference clock signal CLKR. At that moment, output signal $\phi 9$ of flip-flop 9 remains at "L" level. In the period during which reference clock signal CLKR in cycle 2 is at "L" level, "H" level is captured by flip-flops 8, 9.

Output signal $\phi 9$ of flip-flop 9 is raised to be at "H" level in response to the rising edge in cycle 3 (time t3) of reference clock signal CLKR. Accordingly, reset signal /RST is lowered to be at the activated level of "L" level, and output signals CLK1, $\phi 9$ of flip-flops 8, 9 are reset to be at "L" level. Signals CLK1, $\phi 9$ remain at "L" level in cycle 3. Thus, clock signal CLK1 comes to be a signal obtained by dividing the frequency of reference clock signal CLKR by 1/2.

EXAMPLE 2

Figure 5:
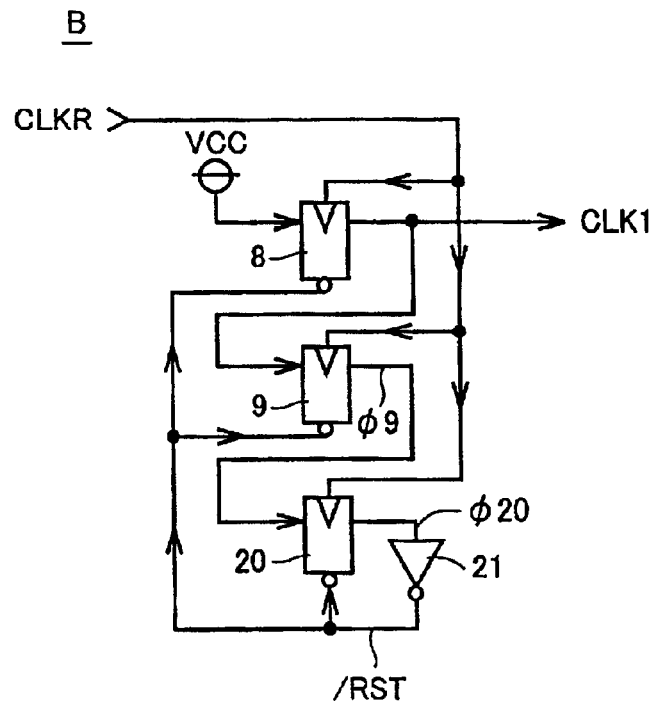
FIG. 5 is a circuit block diagram showing the second illustrative example of the frequency-dividing circuit shown in FIG. 1.

FIG. 5 is a circuit block diagram showing the configuration of a frequency-dividing circuit B having a frequency-dividing ratio of 1/3. FIG. 5 shows frequency-dividing circuit B used as frequency-dividing circuit 1 of the first stage.

Referring to FIG. 5, frequency-dividing circuit B is different from frequency-dividing circuit A shown in FIG. 2 in that inverter 10 is eliminated while a flip-flop 20 and an inverter 21 are added. Flip-flop 20 has a clock terminal into which reference clock signal CLKR is input, a reset terminal into which reset signal /RST is input, and an input terminal into which output signal $\phi 9$ of flip-flop 9 is input. An output signal $\phi 20$ of flip-flop 20 is inverted at inverter 21 to be reset signal /RST.

Figure 6:
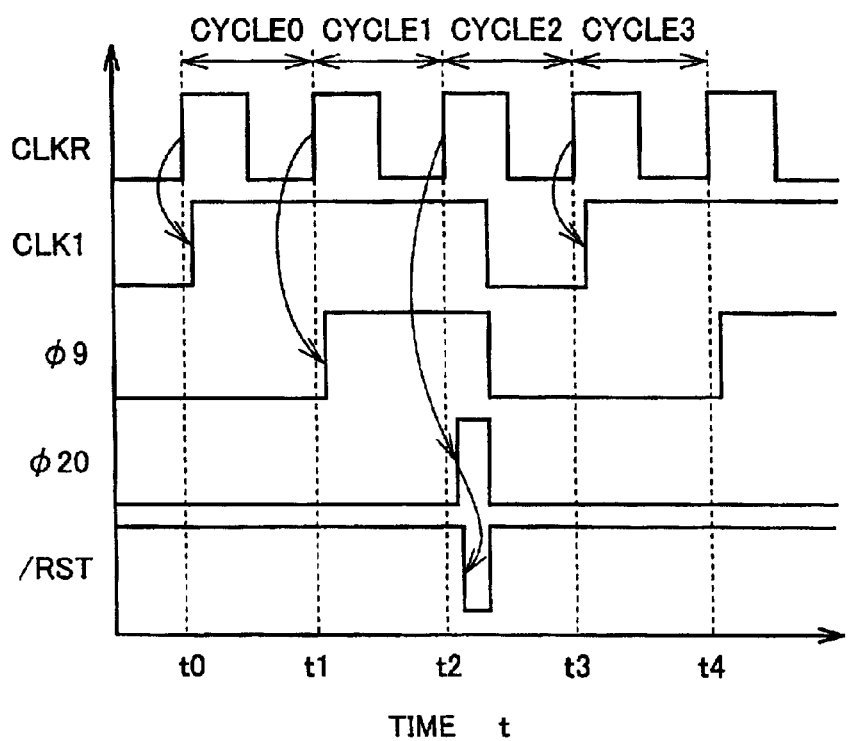
FIG. 6 is a time chart illustrating the operation of the frequency-dividing circuit shown in FIG. 5.

FIG. 6 is a time chart illustrating the operation of frequency-dividing circuit B shown in FIG. 5. Referring to FIG. 6, in the initial state, flip-flops 8, 9 and 20 are reset and respective signals CLK1, $\phi 9$ and $\phi 20$ of flip-flops 8, 9 and 20 are all set to be at "L" level. Then, in the period during which reference clock signal CLKR is at "L" level, "H" level is captured by flip-flop 8 whereas "L" level is captured by flip-flops 9, 20.

Output signal CLK1 of flip-flop 8 is raised to be at "H" level in response to the rising edge in cycle 0 (time t0) of reference clock signal CLKR. At that moment, output signals $\phi 9$, $\phi 20$ of flip-flops 9, 20 remain at "L" level. In the period during which reference dock signal CLKR in cycle 0 is at "L" level, "H" level is captured by flip-flops 8, 9 while "L" level is captured by flip-flop 20.

Output signal $\phi 9$ of flip-flop 9 is raised to be at "H" level in response to the rising edge in cycle 1 (time t1) of reference clock signal CLKR. At that moment, output signals CLK1, φ20 of flip-flops 8, 20 remain, respectively, at "H" level and "L" level. In the period during which reference dock signal CLKR in cycle 1 is at "L" level, "H" level is captured by flip-flops 8, 9 and 20.

Output signal φ20 of flip-flop 20 is raised to be at "H" level in response to the rising edge in cycle 2 (time t2) of reference clock signal CLKYR. Accordingly, reset signal /RST is lowered to be at an activated level of "L" level, and respective output signals CLK1, φ9 and φ20 of flip-flops 8, 9 and 20 are reset to be at "L" level. Subsequently, the same operation as those of cycles 0 to 2 is repeated. Thus, clock signal CLK1 comes to be a signal obtained by dividing the frequency of reference clock signal CLKR by 1/3.

EXAMPLE 3

Figure 7:
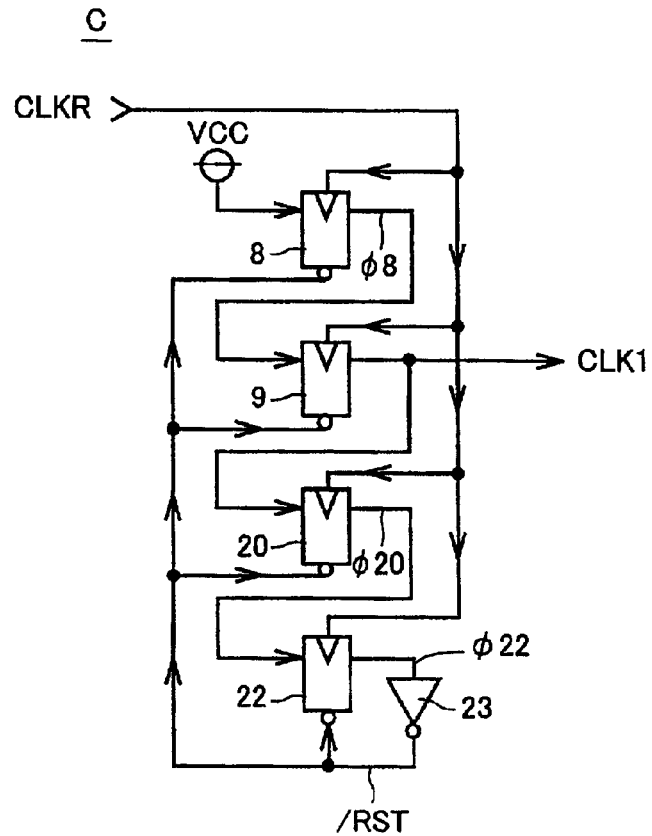
FIG. 7 is a circuit block diagram showing the third illustrative example of the frequency-dividing circuit shown in FIG. 1.

FIG. 7 is a circuit block diagram showing the configuration of a frequency-dividing circuit C having a frequency-dividing ratio of 1/4. In FIG. 7, frequency-dividing circuit C is different from frequency-dividing circuit B shown in FIG. 5 in that inverter 21 is eliminated while a flip-flop 22 and an inverter 23 are added. Flip-flop 22 has a clock terminal into which reference clock signal CLKR is input, a reset terminal into which reset signal /RST is input, and an input terminal into which output signal φ20 of flip-flop 20 is input. Output signal φ22 of flip-flop 22 is inverted at inverter 23 to be reset signal /RST. Moreover, an output clock signal of flip-flop 9 will be output clock signal CLK1 of frequency-dividing circuit C.

Figure 8:
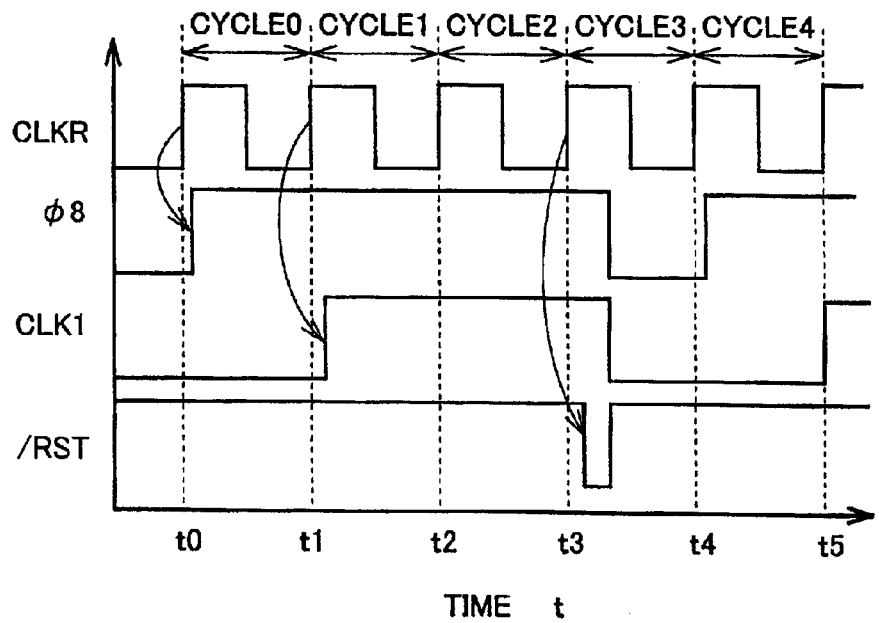
FIG. 8 is a time chart illustrating the operation of the frequency-dividing circuit shown in FIG. 7.

FIG. 8 is a time chart illustrating the operation of frequency-dividing circuit C shown in FIG. 7. Referring to FIG. 8, in frequency-dividing circuit C, output signals φ8, CLK1, φ20 and φ22 of flip-flops 8, 9, 20 and 22 are raised to be at "H" level, respectively, in response to the rising edges in cycles 0, 1, 2 and 3 (time t0, t1, t2 and t3) of reference clock signal CLKR. When output signal φ22 of flip-flop 22 is raised to be at "H" level, reset signal /RST is lowered to be at "L" level, and flip-flops 8, 9, 20 and 22 are reset. Thus, clock signal CLK1 comes to be a signal obtained by dividing the frequency of reference clock signal CLKR by 1/4.

It is noted that, as can be seen from Examples 1 to 3, a frequency-dividing circuit having a frequency-dividing ratio of 1/N (wherein N is an integer equal to or higher than 2) is constituted by N flip-flops connected in series each having a reset function, and an inverter inverting an output signal of a flip-flop of the last stage to generate a reset signal.

Second Embodiment

Figure 9:
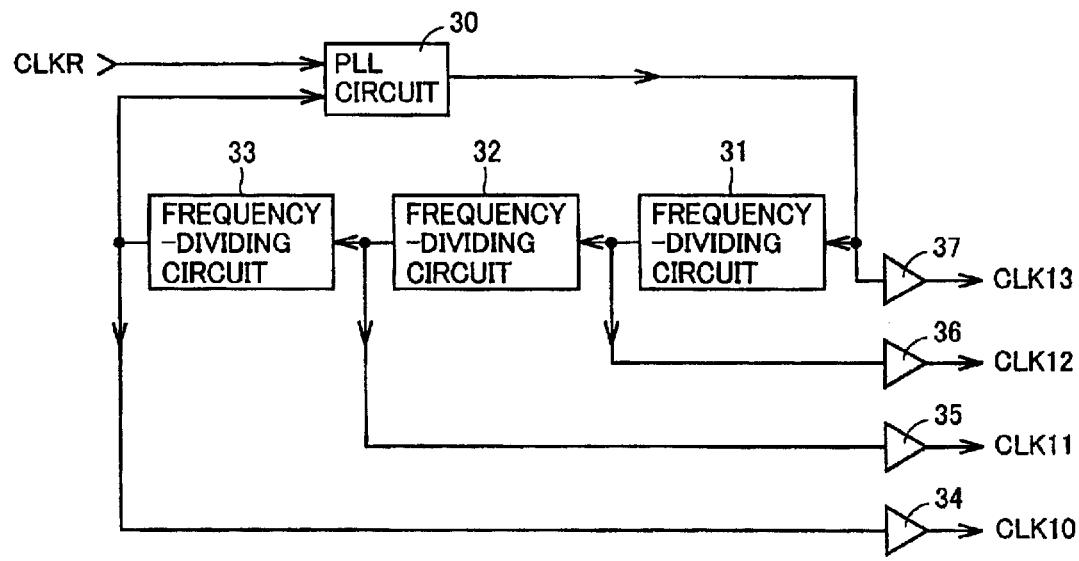
FIG. 9 is a circuit block diagram showing the configuration of a dock generating circuit of a semiconductor integrated circuit device according to the second embodiment of the present invention.

FIG. 9 is a circuit block diagram showing the configuration of a clock generating circuit of a semiconductor integrated circuit device according to the second embodiment of the present invention. The clock generating circuit is to generate a plurality of internal clock signals CLK10 to CLK13 with aligned edges in accordance with an externally-applied reference clock signal CLKR, without it externally receiving a reset signal, and to supply the generated signals to an internal circuit (not shown) of the semiconductor integrated circuit device.

Referring to FIG. 9, this clock generating circuit includes a PLL (phase-locked loop) circuit 30, frequency-dividing circuits 31 to 33, and buffers 34 to 37. Frequency-dividing circuit 31 has a predetermined frequency-dividing ratio of 1/l (wherein l is an integer equal to or higher than 2), and divides the frequency of output clock signal CLK13 of PLL circuit 30 to generate clock signal CLK12. A frequency f12 of clock CLK12 is 1/l times a frequency f13 of output clock signal CLK13 of PLL circuit 30 (f12=f13/l). Clock signal CLK12 is input into frequency-dividing circuit 32, and also is applied to the internal circuit via buffer 36.

Frequency-dividing circuit 32 has a predetermined frequency-dividing ratio 1/m (wherein m is an integer equal to or higher than 2), and divides the frequency of output clock signal CLK12 of frequency-dividing circuit 31 to generate clock signal CLK11. A frequency f11 of clock signal CLK11 is 1/m times the frequency f12=f13/l of clock signal CLK12 (f11=f13/lm). Clock signal CLK11 is input into frequency-dividing circuit 33, and also is applied to the internal circuit via buffer 35.

Frequency-dividing circuit 33 has a predetermined frequency-dividing ratio of 1/n (wherein n is an integer equal to or higher than 2), and divides the frequency of output clock signal CLK11 of frequency-dividing circuit 32 to generate clock signal CLK10. A frequency f10 of clock signal CLK10 is 1/n times the frequency f11=f13/lm of clock signal CLK11 (f10=f13/lmn). Clock signal CLK10 is input into PLL circuit 30, and is also applied to the internal circuit via buffer 34.

Frequency-dividing circuits 31, 32 and 33 are the same as the frequency-dividing circuits described in the first embodiment, and respectively include l, m and n flip-flops with reset function that are connected in series, and each of the frequency-dividing circuits includes an inverter.

PLL circuit 30 receives reference clock signal CLKR and output clock signal CLK10 of frequency-dividing circuit 33, and controls the frequency and phase of clock signal CLK13 such that the frequency and phase of clock signal CLK10 coincides with those of reference clock signal CLKR. Therefore, frequency f10 of clock signal CLK10 is the same as frequency f0 of reference clock signal CLKR. Moreover, frequency f13 of clock signal CLK13 is lmn times the frequency f0 of reference dock signal CLKR (f13=lmnf0, f12=mnf0, f11=nf0, f10=f0).

As described above, according to this clock generating circuit, the plurality of clock signals CLK10 to CLK13 with aligned edges can be generated without external introduction of a reset signal.

Though three frequency-dividing circuits 31 to 33 are connected in series in the second embodiment, the present invention is not limited thereto, and it should be understood that two frequency-dividing circuits, or four or more frequency-dividing circuits may be connected in series.

Figure 10:
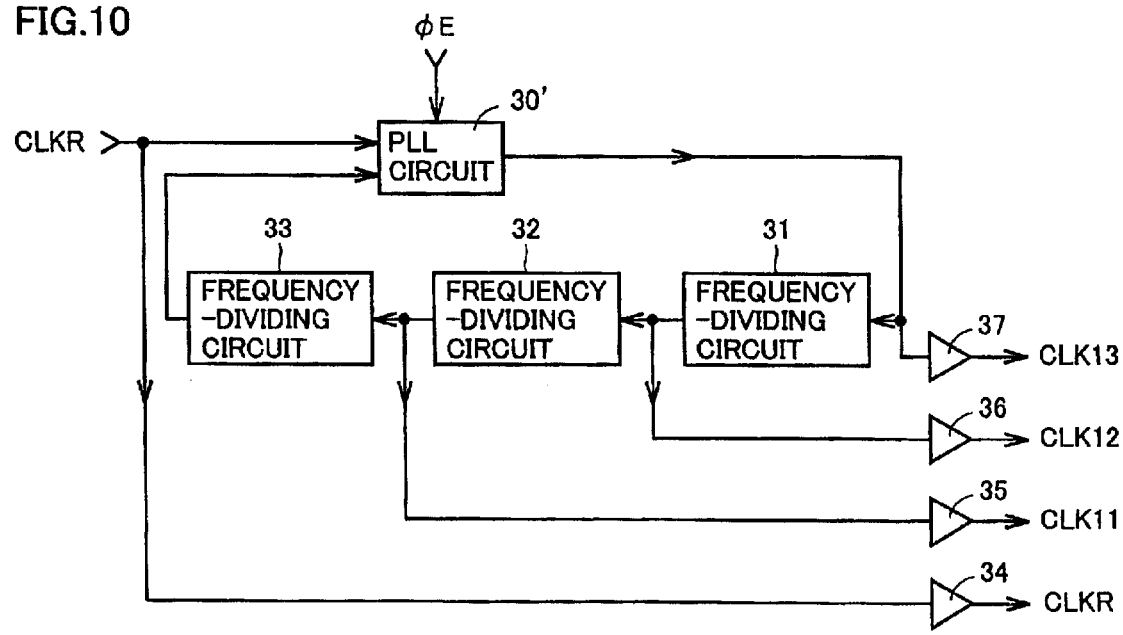
FIG. 10 is a circuit block diagram showing a modified example of the second embodiment.

Moreover, as shown in FIG. 10, PLL circuit 30 may be replaced by a PLL circuit 30', and reference clock signal CLKR may be applied to buffer 34 in place of output clock signal CLK10 of frequency-dividing circuit 33. PLL circuit 30' is activated when a signal φE is at "H" level, and is inactivated when signal φE is at "L" level. In normal operation, signal φE is set to be at "H" level to activate PLL circuit 30', and clock signals CLK11 to CLK13 obtained by multiplying reference clock signal CLKR are used. In low-speed operation, signal φE is set to be at "L" level to inactivate PLL circuit 30', and only reference clock signal CLKR is used. In this case, PLL circuit 30' is stopped at the low-speed operation requiring no clock signals CLK11 to CLK13 with high frequencies, so that power consumption can be reduced.

Furthermore, the first and second embodiments may be combined together, or buffer 34 of the clock generating circuit shown in FIGS. 9 and 10 may be replaced by the clock generating circuit in FIG. 1. In this case, a clock signal with a low frequency obtained by dividing the frequency of reference clock signal CLKR, and a clock signal with a high frequency obtained by multiplying reference dock signal CLKR can be generated.

Third Embodiment

Figure 11:
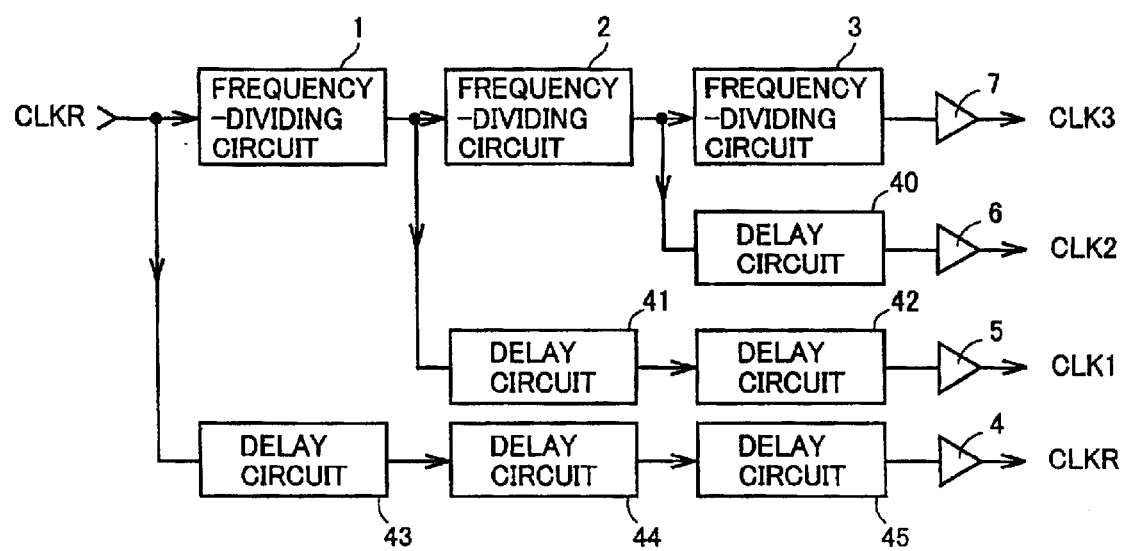
FIG. 11 is a circuit block diagram showing the configuration of a clock generating circuit of a semiconductor integrated circuit device according to the third embodiment of the present invention.

FIG. 11 is a circuit block diagram showing a clock generating circuit of a semiconductor integrated circuit device according to the third embodiment of the present invention, which is compared with FIG. 1. Referring to FIG. 11, this clock generating circuit is different from the clock generating circuit shown in FIG. 1 in that delay circuits 40 to 45 are added.

As shown in FIG. 4, a phase difference due to delay time of frequency-dividing circuit 1 is generated between the rising edge of an input clock signal CLKR and that of an output clock signal CLK1 in frequency-dividing circuit 1. A phase difference is also generated between an input clock signal and an output clock signal in each of frequency-dividing circuits 2 and 3.

Therefore, in the third embodiment, one delay circuit 40 is connected between frequency-dividing circuit 2 and buffer 6, two delay circuits 41 and 42 are connected in series between frequency-dividing circuit 1 and buffer 5, and three delay circuits 43 to 45 are connected in series between an input node of frequency-dividing circuit 1 and buffer 4.

The delay time for each of delay circuits 40 to 45 is set to be equal to the delay time for each of frequency-dividing circuits 1 to 3. Thus, the phase differences among the four internal clock signals CLYR, CLK1 to CLK3 are cancelled.

It should be understood that this method may also be applicable to the clock generating circuit according to the second embodiment.

Fourth Embodiment

Figure 12:
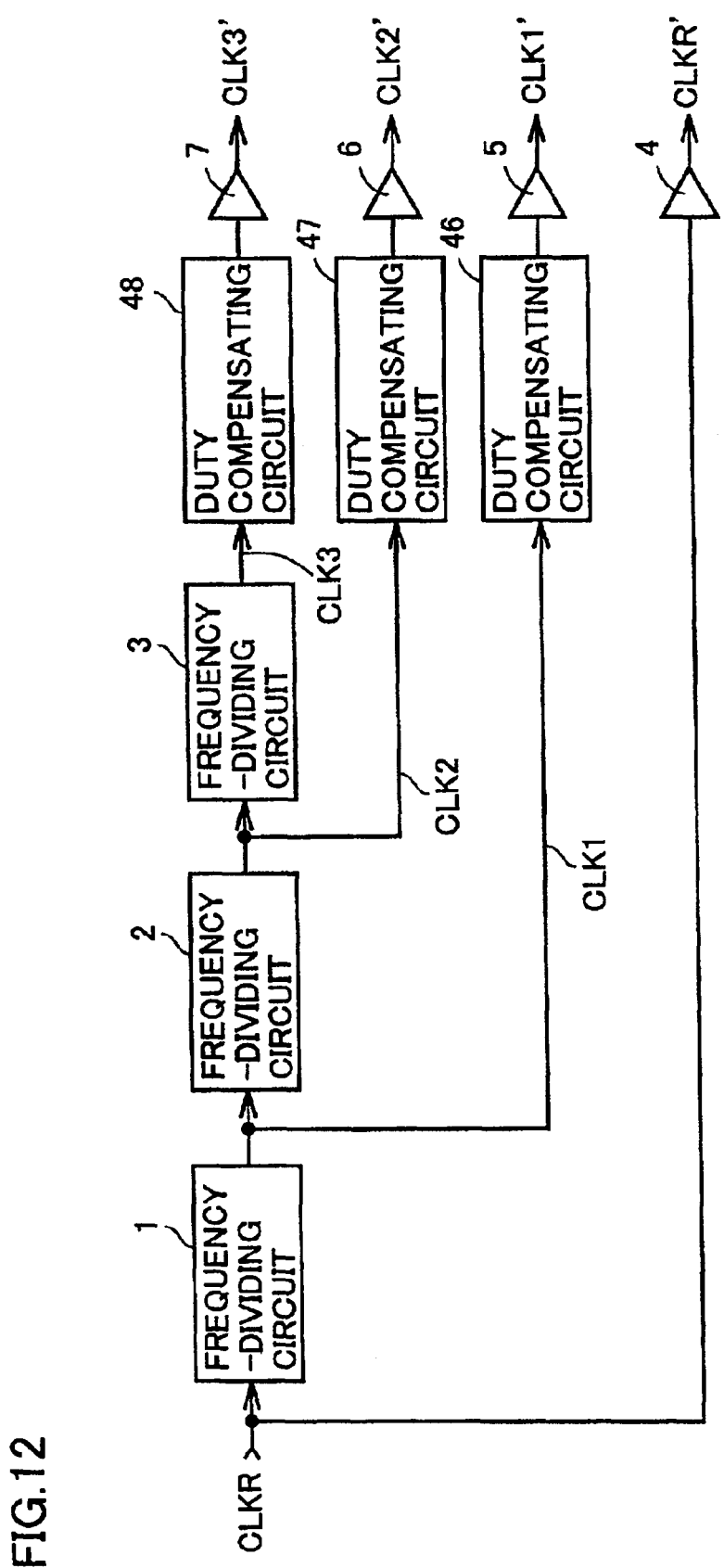
FIG. 12 is a circuit block diagram showing the configuration of a clock generating circuit of a semiconductor integrated circuit device according to the fourth embodiment of the present invention.

FIG. 12 is a circuit block diagram showing the configuration of a clock generating circuit of a semiconductor integrated circuit device according to the fourth embodiment of the present invention, which is compared with FIG. 1. Referring to FIG. 12, this clock generating circuit is different from the clock generating circuit shown in FIG. 1 in that duty compensating circuits 46 to 48 are added.

The duty ratio of the output clock signal of the frequency-dividing circuit as shown in each of FIGS. 4, 6 and 8 is larger than 50%. Therefore, in the fourth embodiment, duty compensating circuits 46 to 48 are provided, respectively, between frequency-dividing circuits 1 to 3 and buffers 5 to 7. This allows the duty ratio of each of internal clock signals CLKR, CLK1 to CLK3 to be 50%. The configuration of a duty compensating circuit will be specifically described below.

EXAMPLE 1

Figure 13:
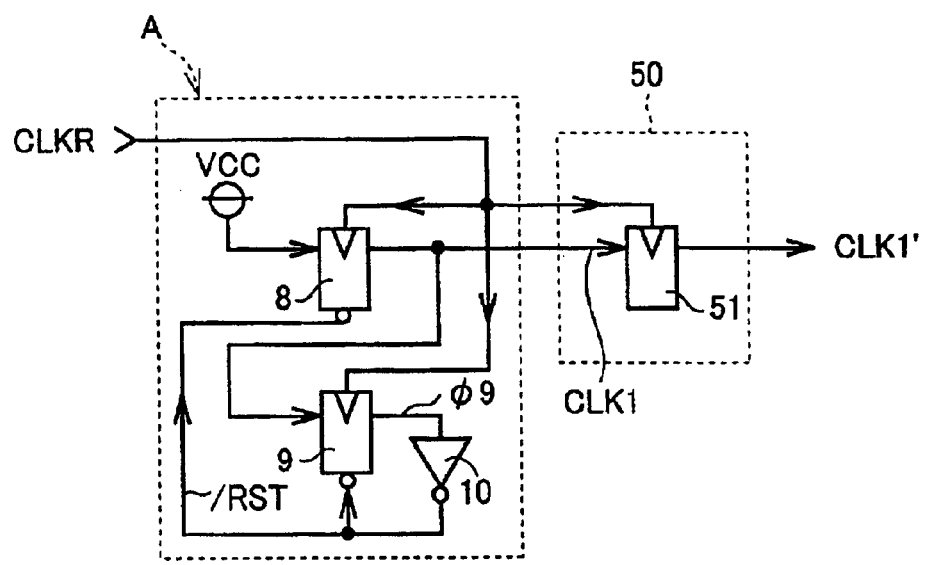
FIG. 13 is a circuit block diagram showing the first illustrative example of the duty compensating circuit shown in FIG. 12.

FIG. 13 is a circuit block diagram showing the configuration of a duty compensating circuit 50 for compensating the duty ratio of output signal CLK1 of frequency-dividing circuit A having the frequency-dividing ratio of 1/2.

Figure 14:
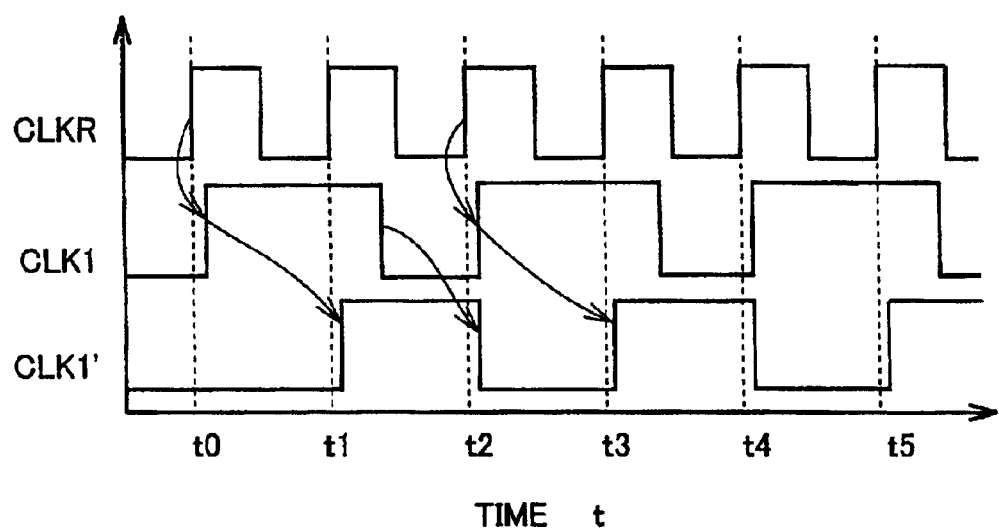
FIG. 14 is a time chart illustrating the operation of the duty compensating circuit shown in FIG. 13.

In FIG. 13, duty compensating circuit 50 includes a flip-flop 51. Flip-flop 51 has a dock terminal to which reference clock signal CLKR, i.e. an input clock signal of frequency-dividing circuit A, is supplied, and an input terminal to which an output clock signal CLK1 of frequency-dividing circuit A is supplied. Flip-flop 51 captures the level of clock signal CLK1 in the period during which reference clock signal CLKR is at "L" level, as shown in FIG. 14, and outputs the captured level in response to the rising edge of reference dock signal CLKR. Therefore, an output clock signal CLK1 of flip-flop 51, i.e. of duty compensating circuit 50, comes to be a clock signal having the duty ratio of 50%.

EXAMPLE 2

Figure 15:
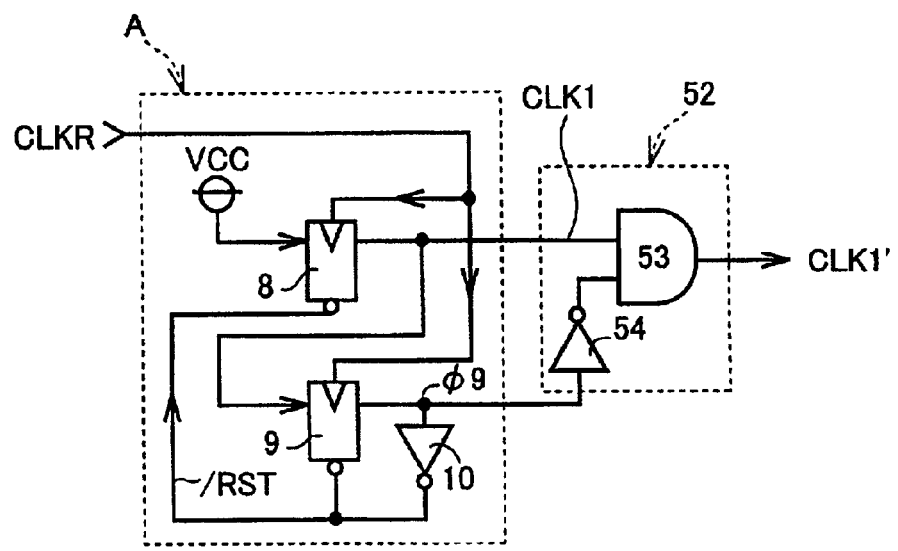
FIG. 15 is a circuit block diagram showing the second illustrative example of the duty compensating circuit shown in FIG. 12.

FIG. 15 is a circuit block diagram showing the configuration of another duty compensating circuit 52 for compensating the duty ratio of output clock signal CLK1 of frequency-dividing circuit A having the frequency-dividing ratio of 1/2.

Figure 16:
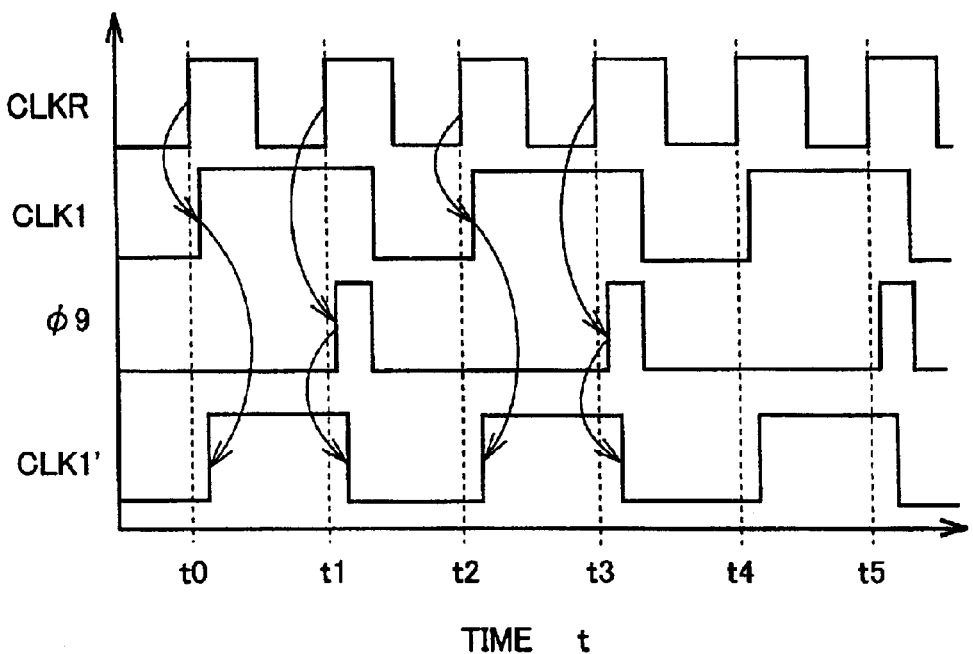
FIG. 16 is a time chart illustrating the operation of the duty compensating circuit shown in FIG. 15.

Referring to FIG. 15, duty compensating circuit 52 includes an AND gate 53 and an inverter 54. Output clock signal CLK1 of frequency-dividing circuit A is applied to one input node of AND gate 53, and signal $\phi 9$ is input into the other input node of AND gate 53 via inverter 54. Output clock signal CLK1' of AND gate 53 is raised to be at "H" level in the period during which clock signal CLK1 is at "H" level and signal $\phi 9$ is at "L" level, as shown in FIG. 16. Therefore, output clock signal CLK1' of duty compensating circuit 52 comes to be a clock signal having the duty ratio of 50%.

EXAMPLE 3

Figure 17:
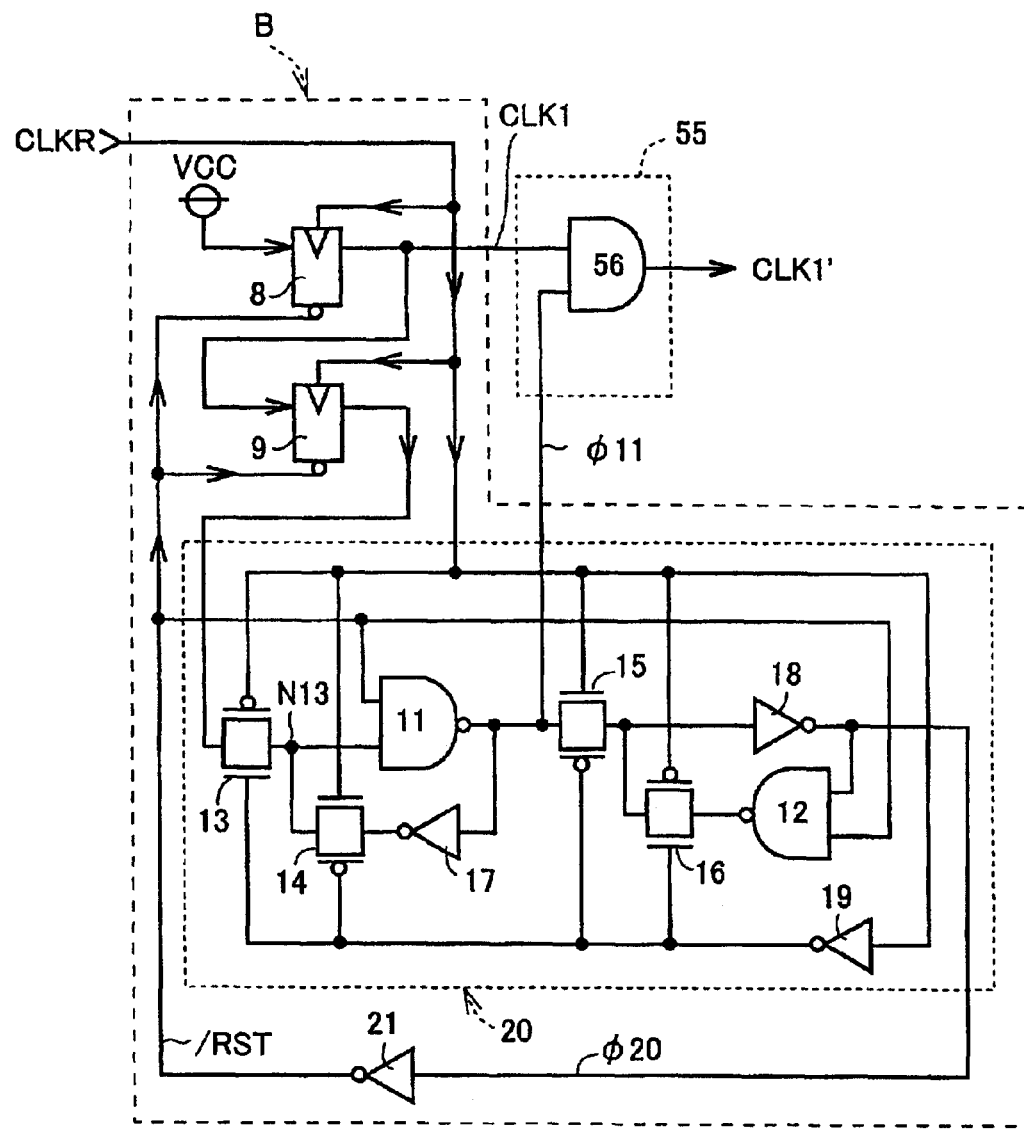
FIG. 17 is a circuit block diagram showing the third illustrative example of the duty compensating circuit shown in FIG. 12.

FIG. 17 is a circuit block diagram showing the configuration of a duty compensating circuit 55 for compensating the duty ratio of output clock signal CLK1 of frequency-dividing circuit B having the frequency ratio of 1/3.

Figure 18:
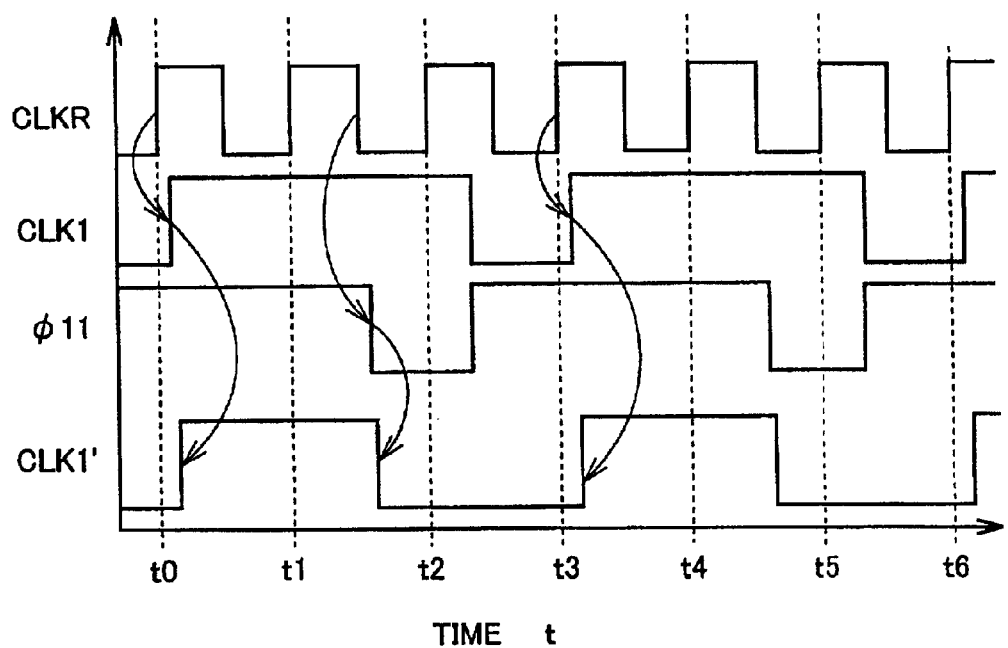
FIG. 18 is a time chart illustrating the operation of the duty compensating circuit shown in FIG. 17.

Referring to FIG. 17, duty compensating circuit 55 includes an AND gate 56. Output clock signal CLK1 of frequency-dividing circuit B is input into one input node of AND gate 56, and output signal $\phi 11$ of NAND gate 11 included in flip-flop 20 is input into the other input node of AND gate 56. As shown in FIG. 18, signal $\phi 11$ is lowered from "H" level to "L" level in response to the second falling edge of reference clock signal CLKR after clock signal CLK1 is raised to be at "H" level, and is raised from the "L" level to "H" level simultaneously with the falling edge of clock signal CLK1. Output clock signal CLK1' of AND gate 56 is raised to be at "H" level in the period during which both clock signals CLK1 and $\phi 11$ are at the "H" level. Therefore, output dock signal CLK1' of duty compensating circuit 55 comes to be a clock signal having the duty ratio of 50%.

EXAMPLE 4

Figure 19:
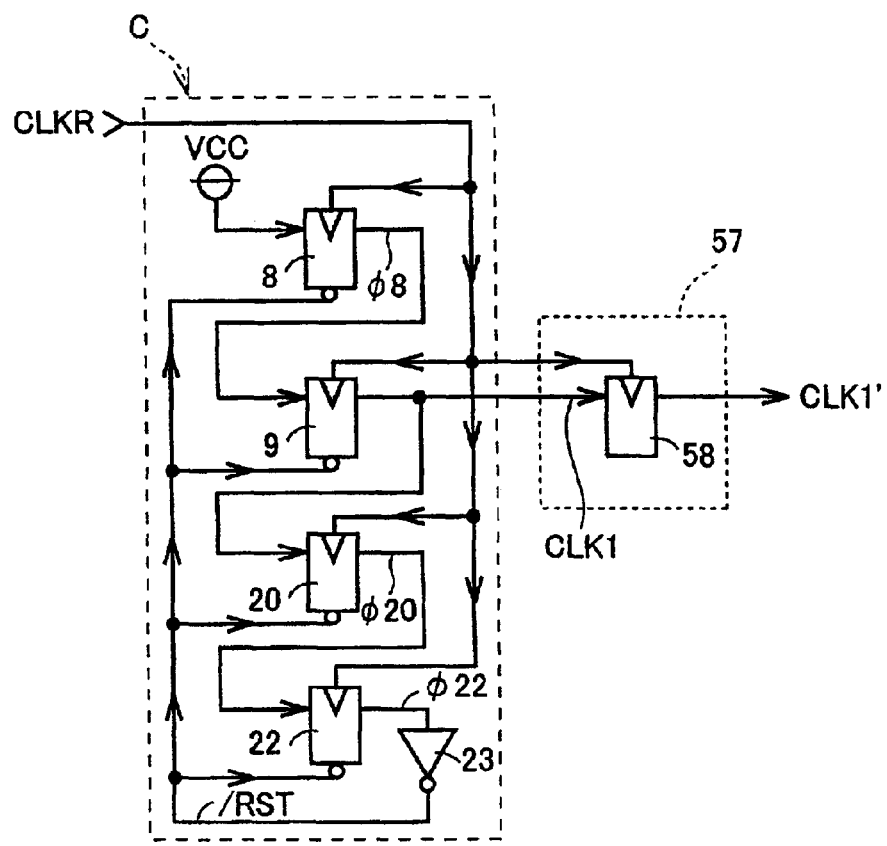
FIG. 19 is a circuit block diagram showing the fourth illustrative example of the duty compensating circuit shown in FIG. 12.

FIG. 19 is a circuit block diagram showing the configuration of a duty compensating circuit 57 for compensating the duty ratio of output clock signal CLK1 of frequency-dividing circuit C having the frequency-dividing ratio of 1/4.

Figure 20:
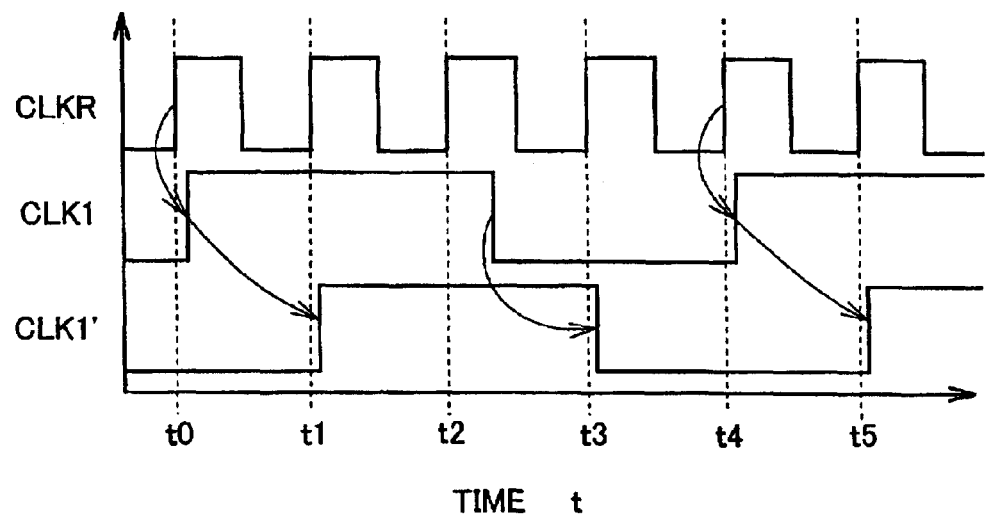
FIG. 20 is a time chart illustrating the operation of the duty compensating circuit shown in FIG. 19.

Referring to FIG. 19, duty compensating circuit 57 includes a flip-flop 58. Flip-flop 58 has a clock terminal to which reference clock signal CLKR, i.e. an input clock signal of frequency-dividing circuit C, is supplied, and an input terminal to which output clock signal CLK1 of frequency-dividing circuit C is supplied. Flip-flop 58 captures, as shown in FIG. 20, the level of clock signal CLK1 in the period during which reference clock signal CLKR is at "L" level, and outputs the captured level in response to the rising edge of reference clock signal CLKR. Therefore, output clock signal CLK' it of flip-flop 58, i.e. of duty compensating circuit 57, comes to be a clock signal having the duty ratio of 50%.

EXAMPLE 5

Figure 21:
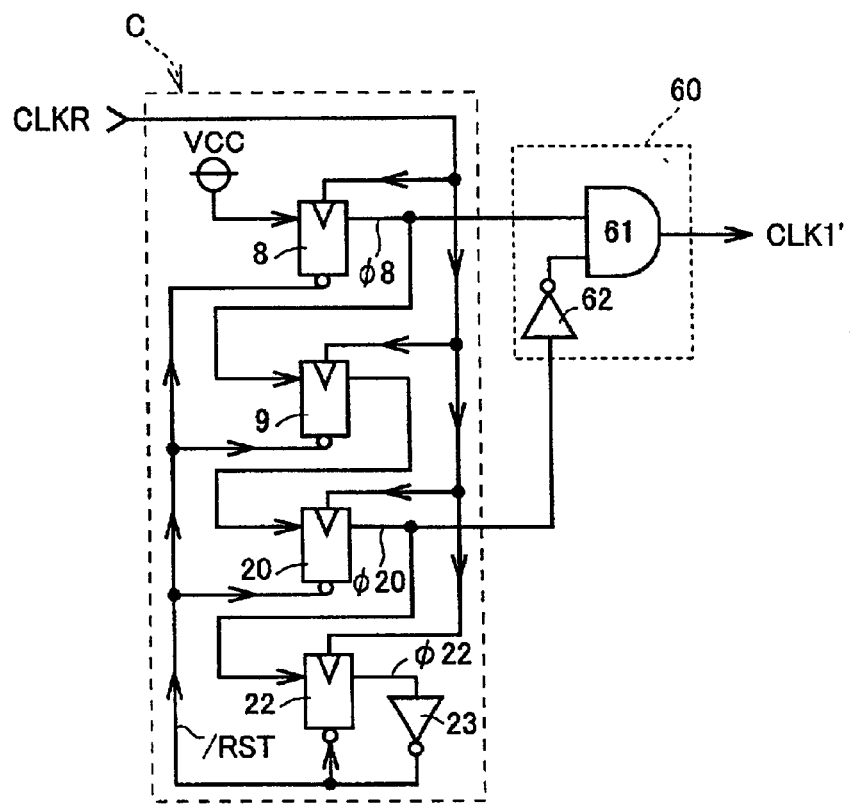
FIG. 21 is a circuit block diagram showing the fifth illustrative example of a duty compensating circuit shown in FIG. 12.

FIG. 21 is a circuit block diagram showing the configuration of another duty compensating circuit 60 for compensating the duty ratio of the output signal of frequency-dividing circuit C having the frequency-dividing ratio of 1/4.

Figure 22:
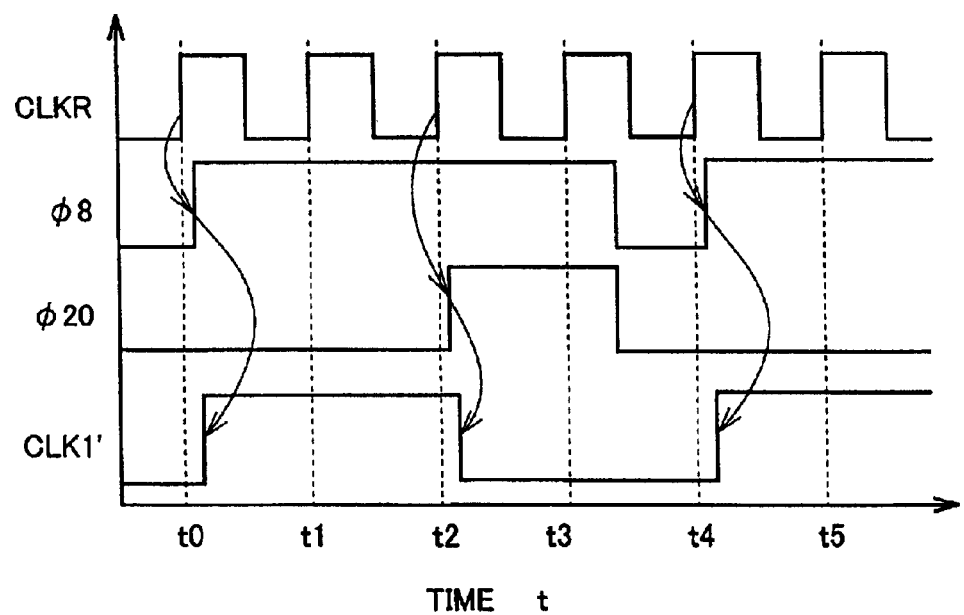
FIG. 22 is a time chart illustrating the operation of the duty compensating circuit shown in FIG. 21.

Referring to FIG. 21, duty compensating circuit 60 includes an AND gate 61 and an inverter 62. Output signal $\phi 8$ of flip-flop 8 included in frequency-dividing circuit C is applied to one input node of AND gate 61, and output signal φ20 of flip-flop 20 is input into the other input node via inverter 62. As shown in FIG. 22, signal 08 is raised from "L" level to "H" level in response to the first rising edge (time t0) of reference clock signal CLKR, and is lowered from "H" level to "L" level in response to the fourth rising edge (time t3) of reference clock signal CLKR, and is further raised from "L" level to "H" level in response to the fifth rising edge (time t4) of reference clock signal CLKR. Moreover, signal φ20 is raised from "L" level to the "H" level in response to the third rising edge (time t2) of reference clock signal CLKR, and is lowered from "H" level to "L" level in response to the fourth rising edge (time t3). Output clock signal CLK1' of AND gate 61 is raised to be at "H" level in the period during which clock signal φ8 is at "H" level and clock signal φ20 is at "L" level. Therefore, output clock signal CLK1' of duty compensating circuit 60 comes to be a clock signal having the duty ratio of 50%.

Modification 1

Figure 23:
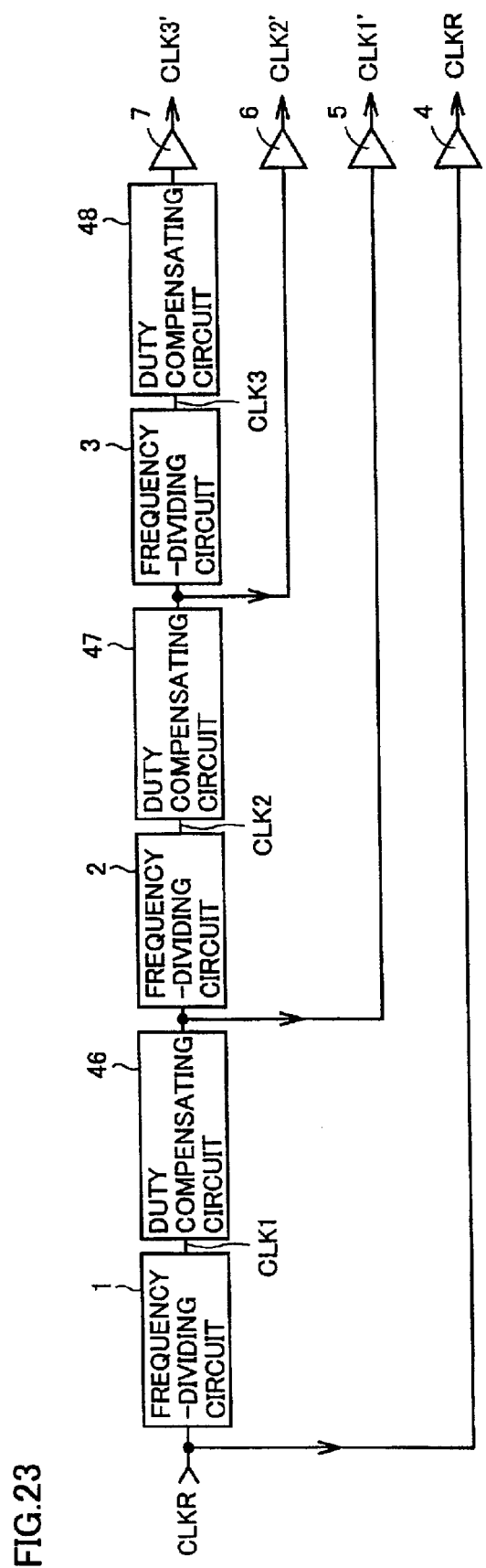
FIG. 23 is a circuit block diagram showing the first modification of the fourth embodiment.

FIG. 23 is a circuit block diagram showing the modification 1 of the fourth embodiment. Referring to FIG. 23, this clock generating circuit is different from the clock generating circuit shown in FIG. 12 in that output clock signals CLK1', CLK2' of duty compensating circuits 46, 47 are also input into frequency-dividing circuits 2, 3, respectively. This clock generating circuit can also attain the same effect as that of the clock generating circuit shown in FIG. 12.

Modification 2

Figure 24:
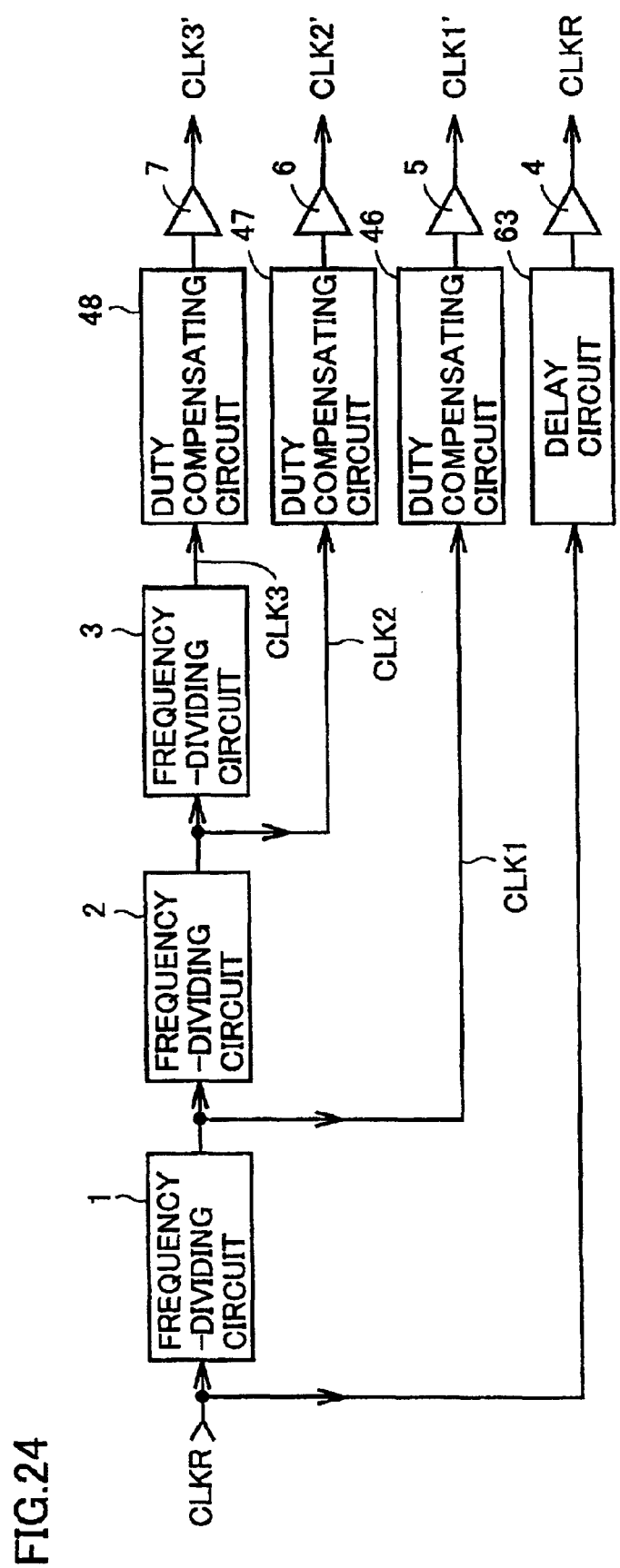
FIG. 24 is a circuit block diagram showing the second modification of the fourth embodiment.

FIG. 24 is a circuit block diagram showing the modification 2 of the fourth embodiment. Referring to FIG. 24, this dock generating circuit is different from the clock generating circuit shown in FIG. 21 in that a delay circuit 63 is added. Delay circuit 63 has the same delay time as that of each of duty compensating circuits 46 to 48, and delays reference clock signal CLKR and supplies the delayed signal to buffer 4. Therefore, the edges of internal clock signals CLKR, CLK1' to CLK3' can be more precisely aligned.

Modification 3

Figure 25:
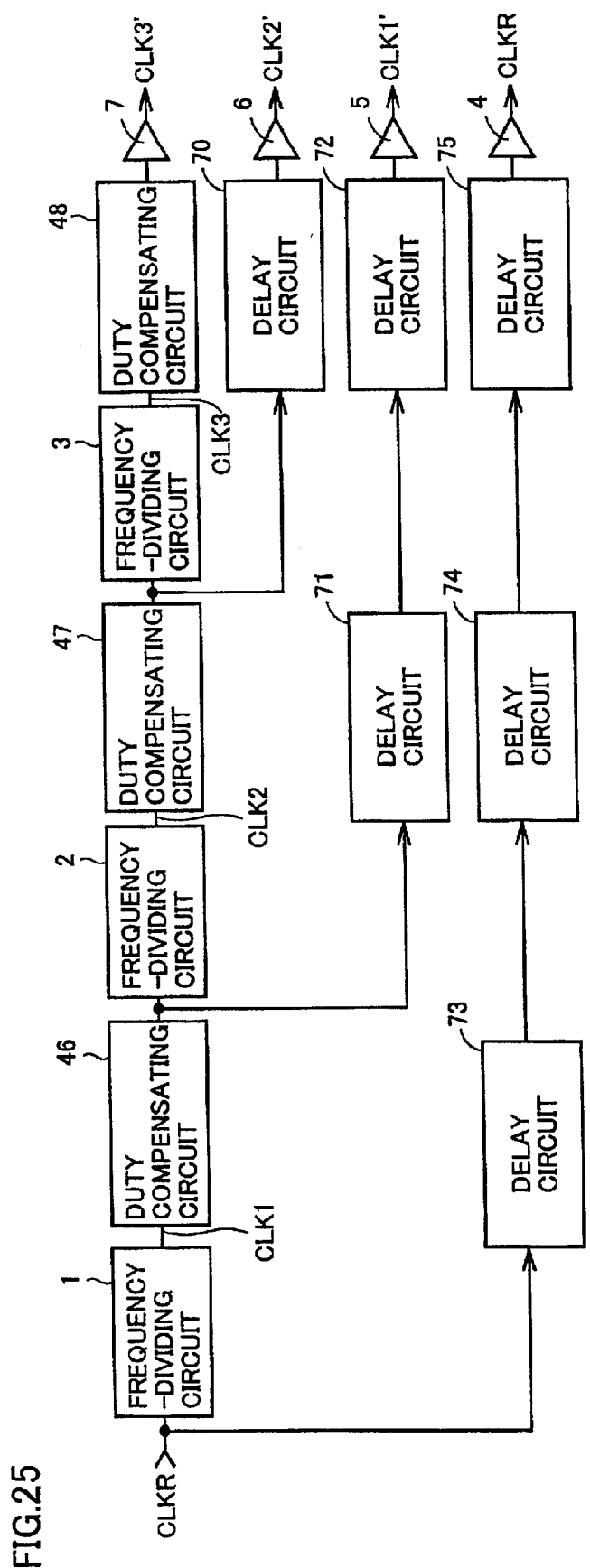
FIG. 25 is a circuit block diagram showing the third modification of the fourth embodiment.
Figure 26:
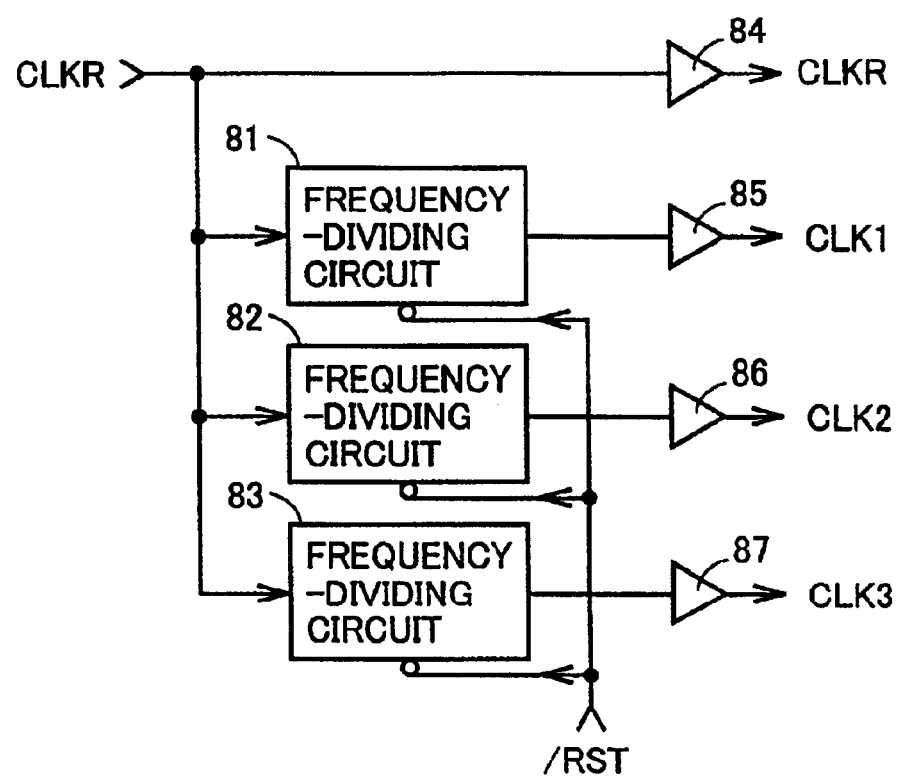
FIG. 26 is a circuit block diagram showing the configuration of the clock generating circuit of the conventional semiconductor integrated circuit device.
Figure 27:
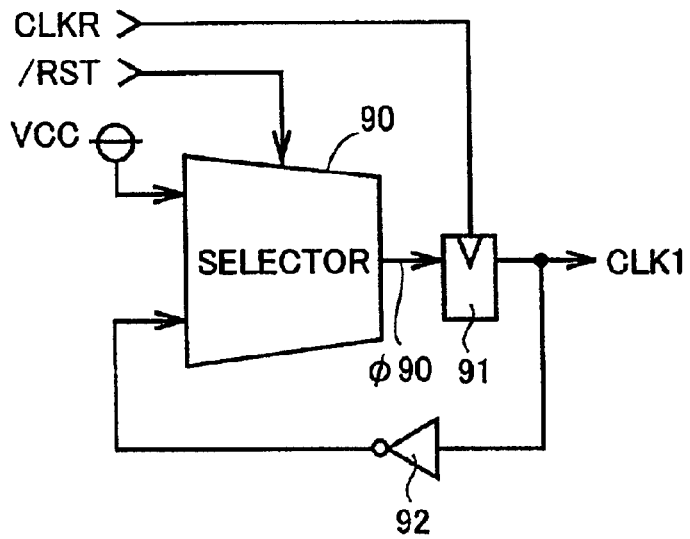
FIG. 27 is a circuit block diagram showing the configuration of the frequency-dividing circuit shown in FIG. 26.
Figure 28:
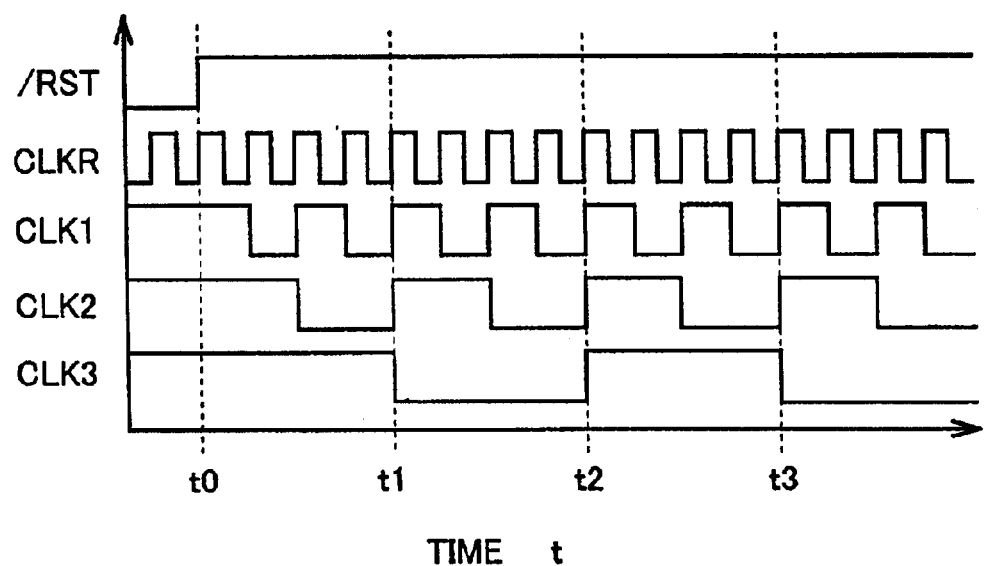
FIG. 28 is a time chart illustrating the operation of the clock generating circuit shown in FIG. 26.

FIG. 25 is a circuit block diagram showing the modification 3 of the fourth embodiment. Referring to FIG. 25, this clock generating circuit is different from the clock generating circuit in FIG. 23 in that delay circuits 70 to 75 are added.

If Delay circuit 70 delays output clock signal CLK2' of duty compensating circuit 47 and supplies the delayed signal to buffer 6. Delay circuits 71, 72 delay output clock signal CLK1' of duty compensating circuit in 46 and supply the delayed signal to buffer 5. Delay circuits 73 to 75 delay reference clock signal CLKR and supply the delayed signal to buffer 4.

The delay time for each of delay circuits 70 to 75 is set to be equal to the delay time for each of duty compensating circuits 46 to 48. Therefore, the phase differences among the four internal clock signals CLKR, CLK1', CLK3' is cancelled.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock generating circuit generating a plurality of clock signals having different frequencies, comprising:
   a plurality of stages of frequency-dividing circuits connected in series, each of said plurality of stages outputting a respective clock signal to be coupled to a respective buffer circuit for operation at a corresponding clock freguency,
   a phase control circuit having a first input receiving a reference clock signal and a second input receiving the clock signal output by a last of said plurality of stages as a feedback clock signal, and said phase control circuit outputting an output clock signal to a first of said plurality of stages,
   wherein the output clock signal of the phase control circuit coincides in phase with both the feedback clock signal and the reference clock signal, wherein
      each of said frequency-dividing circuits includes a plurality of stages of flip-flops connected in series, wherein an input terminal of a first stage of the flip-flops receives a first potential, each flip-flop capturing a potential at its input terminal in a period during which an input clock signal of said each frequency-dividing circuit is at a second potential, outputting the captured potential in response to a change of the input clock signal of said each frequency-dividing circuit from the second potential to the first potential, and being reset in response to an output of the first potential from a last stage of said plurality of stages of flip-flops, to output the second potential, and
      an output clock signal of a predetermined flip-flop of said plurality of flip-flops is an output clock signal of said each frequency-dividing circuit.

2. A clock generating circuit generating a plurality of clock signals having different frequencies, comprising:
   a plurality of stages of frequency-dividing circuits connected in series, each of said plurality of stages outputting a respective clock signal; and
   a phase control circuit having a first input receiving a reference clock signal and a second input receiving the clock signal output by a last of said plurality of stages as a feedback clock signal, and said phase control circuit outputting an output clock signal to a first of said plurality of stages,
   wherein the output clock signal of the phase control circuit coincides in phase with both the feedback clock signal and the reference clock signal, and wherein each of said frequency-dividing circuits includes a plurality of stages of flip-flops connected in series, wherein an input terminal of a first stage of the flip-flops receives a first potential, an input terminal of each stage of the flip-flops except the first stage-of the flip-flops is connected to an output terminal of a preceding stage of the flip-flops, each flip-flop capturing a potential at its input terminal in a period during which an input clock signal of said each frequency-dividing circuit is at a second potential, outputting the captured potential at its output terminal in response to a change of the input clock signal of said each frequency-dividing circuit from the second potential to the first potential, and being reset in response to an output of the first potential from a last stage of said plurality of stages of flip-flops, to output the second potential, and
   an output clock signal of a predetermined flip-flop of said plurality of flip-flops is an output clock signal of said each frequency-dividing circuit.

* * * * *